(12) United States Patent
Simon

(10) Patent No.: US 7,423,467 B1
(45) Date of Patent: Sep. 9, 2008

(54) CIRCUIT FOR CONTROLLING DUTY CYCLE DISTORTION

(75) Inventor: Daniel L. Simon, Glendale, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 56 days.

(21) Appl. No.: 11/443,813

(22) Filed: May 30, 2006

(51) Int. Cl.
*H03K 3/017* (2006.01)

(52) U.S. Cl. .................. 327/175; 327/172

(58) Field of Classification Search .......... None
See application file for complete search history.

(56) References Cited

U.S. PATENT DOCUMENTS 5,963,071 A * 10/1999 Dowlatabadi .......... 327/175
6,603,339 B2 * 8/2003 Atallah et al. .......... 327/175
7,088,160 B2 * 8/2006 Harms et al. .......... 327/175

* cited by examiner

Primary Examiner—Cassandra Cox

(57) ABSTRACT

A circuit for controlling a duty cycle of a clock signal. The circuit includes a duty cycle control loop that includes a voltage-to-duty cycle (V-to-DC) converter, an output driver, a duty-cycle-to voltage (DC-to-V) converter, and an operational amplifier. The V-to-DC converter receives an input clock signal. The output driver is coupled to the V-to-DC converter and provides an output clock signal that is associated with a duty cycle distortion value. The DC-to-V converter converts the output clock signal to an average voltage. The operational amplifier amplifies an error between the average voltage and a reference voltage. The error is fed back to the V-to-DC converter through a negative feedback loop, wherein the V-to-DC converter adjusts a duty cycle of the input clock signal based on the error.

19 Claims, 4 Drawing Sheets

CIRCUIT FOR CONTROLLING DUTY CYCLE DISTORTION

BACKGROUND OF THE INVENTION

1. Field of the Invention

Embodiments of the present invention relate to the field of timing controllers. More particularly, embodiments of the present invention relate generally to duty cycle control of a clock signal through a negative feedback control loop.

2. Related Art

Liquid crystal displays (LCDs) are important to the television market. However, pushing LCDs to the next generation by simply scaling existing LCD monitor panels to wider formats (e.g., 16:9 HDTV) and larger formats is a complicated endeavor. A number of television requirements push beyond conventional state-of-the art monitors. For instance, response time, brightness, contrast, color envelope, color temperature, and progressive scan-and-hold issues require a re-engineering of the monitor solution.

Specifically, LCD televisions bring forward a completely new set of challenges that are broader than simple data signaling issues. The demand for up to HDTV formats (1920× 1080) on display sizes beyond 50 inches are problematic. For example, longer transmission distances (due to larger display sizes) and higher data rates (due to larger pixel formats) combine to push clock and data registration beyond stable limits.

In particular, many high speed interfaces, such as those required in displays, tightly specify the minimum and maximum duty cycle that an output clock can exhibit and still stay within specification. This duty cycle distortion can enter and accumulate anywhere along the clock path from the clock source to the output driver and anywhere in between. Examples of where duty cycle distortion can enter the system include the input buffer, on-chip clock generators such as phase-locked loops (PLLs) and oscillators, long clock buffer trees, multiplexors, the output buffer, etc.

In a chip with a high speed interface, any variation of the output clock high/low time on the order of hundreds of picoseconds can throw an otherwise good device outside the specified range and thus lower the yield of the given product.

SUMMARY OF THE INVENTION

Accordingly, various embodiments of the present invention disclose a circuit and method for a controlling the duty cycle of a clock signal. Embodiments of the present invention are capable of controlling a clock signal duty cycle through a negative feedback loop that continually measures and adjusts an output clock duty cycle. As such, high speed interface chips are able to sufficiently control the duty cycle of an output clock signal to stay within tight tolerances.

Specifically, in one embodiment, a duty cycle control loop is described. The duty cycle control loop controls a duty cycle of a clock signal. The duty cycle control loop comprises a voltage-to-duty cycle (V-to-DC) converter, an output driver, a duty-cycle-to voltage (V-to-DC) converter, and an operational amplifier. The V-to-DC converter receives an input clock signal. The output driver is coupled to the V-to-DC converter and providing an output clock signal based on the input clock signal. The output clock signal is associated with a duty cycle distortion value. The DC-to-V converter is coupled to the output driver and converts the output clock signal to an average voltage. The operational amplifier is coupled to the DC-to-V converter and amplifies an error between the average voltage and a reference voltage. The error is fed back to the V-to-DC converter, wherein the V-to-DC converter adjusts a duty cycle of the input clock signal based on the error.

In another embodiment, a method for controlling duty cycle of a clock signal is described. The method includes measuring a duty cycle of an output clock signal. The output clock signal is based on an input clock signal that accumulates duty cycle distortion. The duty cycle distortion is due in part from a clock tree supplying the clock signal to a timing controller. The method also generates an error of the duty cycle when converted to a voltage in comparison with a reference voltage. The reference voltage corresponds to a fifty percent duty cycle of the input clock signal without any duty cycle distortion. Thereafter, the method adjusts the duty cycle of the output clock signal based on the error through a negative feedback loop.

DETAILED DESCRIPTION OF THE INVENTION

Figure 1:
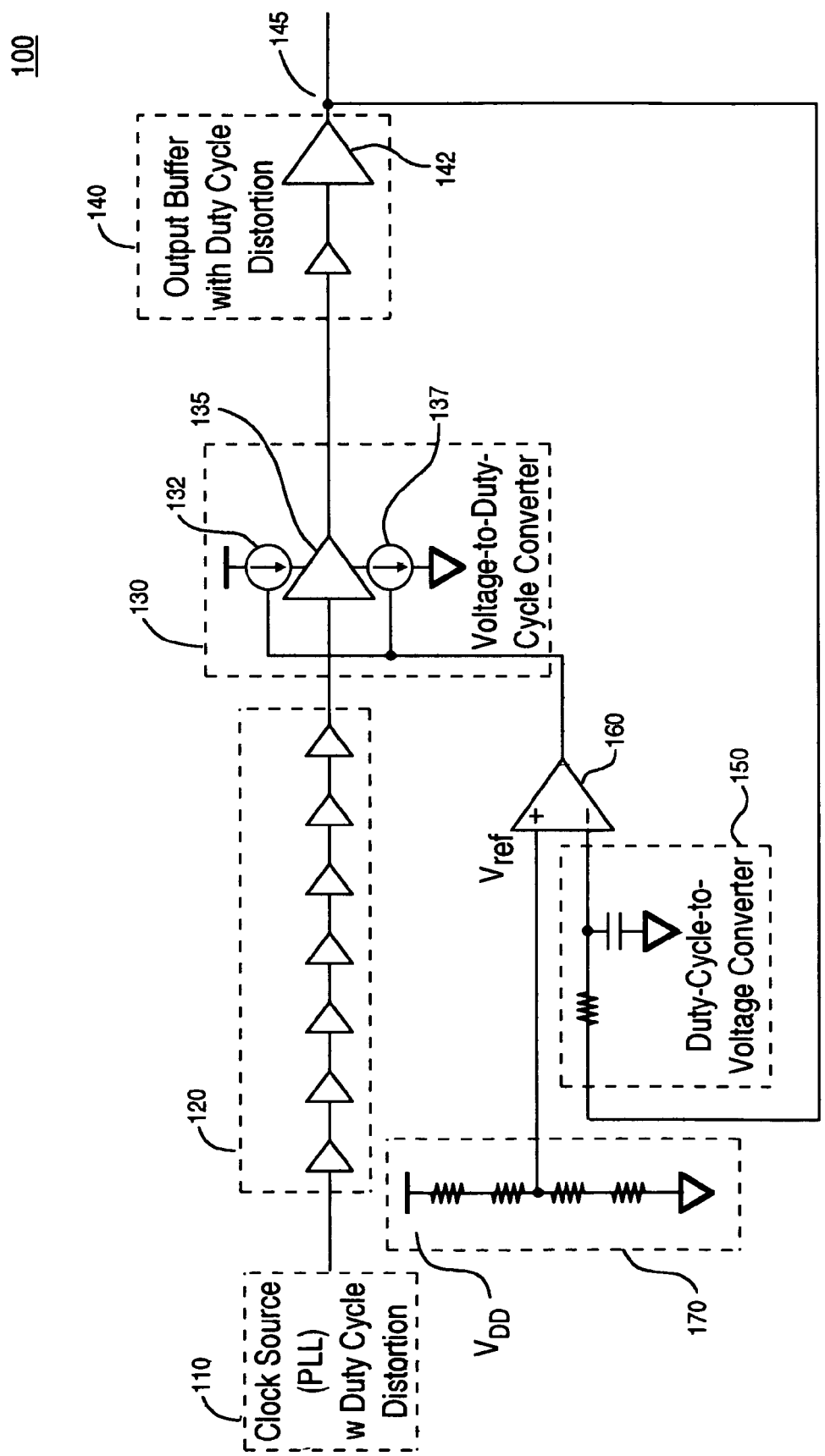
FIG. 1 is a block diagram of a duty cycle control loop, in accordance with one embodiment of the presently claimed invention.

Reference will now be made in detail to the preferred embodiments of the present invention, a circuit and method for controlling duty cycle of a clock signal, examples of which are illustrated in the accompanying drawings.

Accordingly, various embodiments of the present invention disclose a duty cycle control circuit and method for controlling a duty cycle of a clock signal. Embodiments of the present invention are capable of controlling a clock signal duty cycle through a negative feedback loop that continually measures and adjusts an output clock duty cycle. As such, high speed interface chips are able to sufficiently control the duty cycle of an output clock signal.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alphanumeric or alphanumeric designators. Further, while the present invention has been discussed in the context of implementations using discrete electronic circuitry, the functions of any part of such circuitry may alternatively be implemented using one or more appropriately programmed processors, depending upon the signal frequencies or data rates to be processed.

Some embodiments of the present invention are implemented within a point-to-point differential signaling (PPDS™) system for communication within a television or high-end monitor. The PPDS™ data signaling system provides a single channel, direct point-to-point link between the timing controller and each column driver of a display device. In one embodiment, PPDS™ is a system of separate, point-to-point links, wherein a single channel is associated with a column driver. This channel carries column-driver control information and digital voltage values that are converted to into analog by the column driver. In the PPDS™ system, all the column drivers simultaneously receive their data. As such, even if there is a single differential channel supplying each column driver with data, the channel is used continuously. Still other embodiments are implemented within any data channel communication system.

Referring to FIG. 1, a duty cycle control loop is shown in accordance with one embodiment of the presently claimed invention. The duty cycle control loop is part of a circuit 100 that is capable of controlling duty cycles of a clock signal. As shown in FIG. 1, the intent of the duty cycle control loop in the circuit 100 is to provide a mechanism to measure the output clock duty cycle of the circuit 100 after all contributions of duty cycle distortion have been made and then readjust or recenter the output duty cycle to an optimum duty cycle.

The duty cycle control loop comprises a voltage to duty cycle (V-to-DC) converter 130 for receiving an input clock signal. In particular, the V-to-DC converter 130 is used for adjusting the duty cycle of the input clock signal that is received at the V-to-DC converter 130.

The input clock signal is generated originally from a clock source 110. For example, in one embodiment, the clock source 110 is from a phase-locked loop. In another embodiment, the clock source 110 is a crystal oscillator. The clock source 110 provides a stable clock signal at a consistent frequency over time.

The input clock signal accumulates duty cycle distortion throughout a clock path from the clock source 110 to an output node 145. The output node 145 provides a clock source that is external to the chip including the circuit 100 providing duty cycle control. For instance, the chip is a display controller that provides video information to a display. Video information is stored in memory (e.g., RAM, SDRAM, DDR SDRAM, etc.) through an on-chip timing controller. In one case, the timing controller distributes the input clock signal to a random access memory that is external the chip for purposes of storing the video information, in accordance with one embodiment of the present invention.

In the present embodiment, the input clock signal is an alternating signal that goes high and low. That is, the clock signal alternates between high and low. In addition, the duty cycle of the clock signal is defined as the average time the clock signal is high over a period. Specifically, the duty cycle is expressed as a percentage. In one embodiment, the optimum duty cycle of the clock signal is fifty percent. As such, embodiments of the present invention are able to adjust the clock signal internal to the chip such that on average the output clock signal at node 145 has a duty cycle that is substantially 50 percent.

The input clock signal accumulates duty cycle distortion throughout the clock path from the clock source 110 to the output node 145. For instance, duty cycle distortion is accumulated through a clock tree 120 that is coupled to the clock source 110 and the V-to-DC converter 130. The clock tree 120 comprises a plurality of buffers, each of which provide the clock signal to a timing controller for storing video information in an external memory. Each of the plurality of buffers introduces duty cycle distortion which is accumulated through the clock tree 120.

In addition, the duty cycle control loop also comprises an output driver 140 that is coupled to the V-to-DC converter 130. The output driver provides the output clock signal to the output node 145. The output clock signal is based on the input clock signal from the clock source 110. As previously described, the clock signal at the output node 145 has accumulated duty cycle distortion when compared to the input clock source from the clock source 110. That is, the output clock signal at the output node 145 is associated with a duty cycle distortion value. Also, the output driver 140 contributes additional duty cycle distortion to the input clock signal. As such, embodiments of the present invention are capable of compensating for the accumulated duty cycle distortion that is present at the output node 145.

In one embodiment, the output driver 140 comprises an output buffer 142. The output buffer 142 is coupled to the V-to-DC converter 130 and outputs the output clock signal at node 145.

The duty cycle control loop of the circuit 100 also includes a duty-cycle-to-voltage (DC-to-V) converter 150 that is coupled to the output driver 140. The DC-to-V converter 150 converts the output clock signal to an average voltage for use in the duty cycle control loop. That is, the present embodiment is able to continually measure the output clock signal duty cycle at node 145 after all the sources of duty cycle distortion have been contributed.

In one embodiment, the DC-to-V converter 150 is a resistor capacitor (RC) filter or circuit. The RC filter converts the duty cycle of the output clock signal from the output node 145 to voltage. In one embodiment, the duty cycle conversion is calculated according to the following equation (1):

$$\text{Voltage} = V_{DD} * (\text{Duty Cycle})/100 \qquad (1)$$

In equation 1, the duty cycle is expressed in percentages, voltage is in volts, and $V_{DD}$ is the supply voltage.

In one embodiment, the duty cycle control loop comprises an operational amplifier 160. The operational amplifier 160 is coupled to the DC-to-V converter 150. The inputs to the operational amplifier 160 is the converted voltage of the duty cycle from the DC-to-V converter 150 and a reference voltage ($V_{ref}$). Specifically, the operational amplifier 160 amplifies an error between the average voltage from the DC-to-V converter 150 and $V_{ref}$. That is, the operational amplifier 160 performs a duty cycle error summation and amplification for the duty cycle control loop of the circuit 100. In one embodiment, the design of the operational amplifier 160 includes phase compensation to ensure the stability of the duty cycle negative feedback control loop of the circuit 100. In another embodiment, the operational amplifier 160 comprises a single stage with large input devices.

In one embodiment, the reference voltage, $V_{ref}$, is generated from a voltage divider 170 (e.g., resistor ladder). The voltage divider 170 comprises a plurality of series resistances coupled between a supply voltage, $V_{DD}$, and ground for conveying a reference voltage. That is, $V_{ref}$ can be generated from a voltage divider of the supply voltage, $V_{DD}$. As such, the DC-to-V converter 150 and the voltage divider 170 are capable of being scaled with the power supply, $V_{DD}$, which makes the duty cycle control loop of the circuit 100 more robust. For instance, the resistors in the voltage divider 170 are selected to generate $V_{ref}$ that is equal to a fifty percent duty cycle of the input clock signal from the clock source 110, in one embodiment.

In addition, the resistors in the voltage divider 170 are selected to compensate for inherent offsets in the operational amplifier 160. Specifically, the offsets in the operational amplifier 160 may skew the error. By proper selection of the resistors in the voltage divider 170, the offset is compensated for, therefore providing the proper error to the duty cycle control loop.

In one embodiment, the error is fed back to the V-to-DC converter 130 to complete the negative feedback loop. In particular, the V-to-DC converter 130 is able to adjust a duty cycle of the input clock signal that is received based on the error. In particular, the V-to-DC converter 130 comprises a current starved inverter stage comprising the current starved inverter 135 that is capable of adjusting the input clock signal received from the clock tree 120 in order to adjust the duty cycle of the output clock signal at node 145. Specifically, the V-to-DC converter 130 alters the rise and fall times of the input clock signal to adjust the duty cycle measured at the output node 145. The amount of duty cycle change varies with a change in the control voltage to the current sources 132 and 137 according to a defined gain (e.g., that indicates zero error). In one embodiment, the devices in the circuit 100 are sized to give the smallest possible duty-cycle-to-voltage gain in order to reduce the effects of offsets and other inaccuracies in the control loop.

More specifically, the current starved inverter 135 receives the input clock signal from the clock tree 120. In addition, the a current source 132 is coupled to receive the error from the DC-to-V converter 150 and is coupled to the current starved inverter 135. In addition, the current source 132 is coupled to the power supply voltage, $V_{DD}$, a constant voltage. In one embodiment, the current source 132 is a p-type metal oxide semiconductor (PMOS).

The current source 132 increases a duty cycle of the input clock signal, in one embodiment. That is, the current source 132 is able to adjust the leading edge of the input clock signal from the clock tree 120, such that the duty cycle of the output clock signal at the node 145 approaches the optimum value.

In addition, the a current source 137 is coupled to receive the error from the DC-to-V converter 150 and is coupled to the current starved inverter 135. In addition, the current source 132 is coupled to the ground. In one embodiment, the current source 137 is an n-type metal oxide semiconductor (NMOS).

The current source 137 decreases a duty cycle of the input clock signal, in one embodiment. That is, the current source 137 is able to adjust the falling edge of the input clock signal from the clock tree 120, such that the duty cycle of the output clock signal at the node 145 approaches the optimum value.

Figure 2:
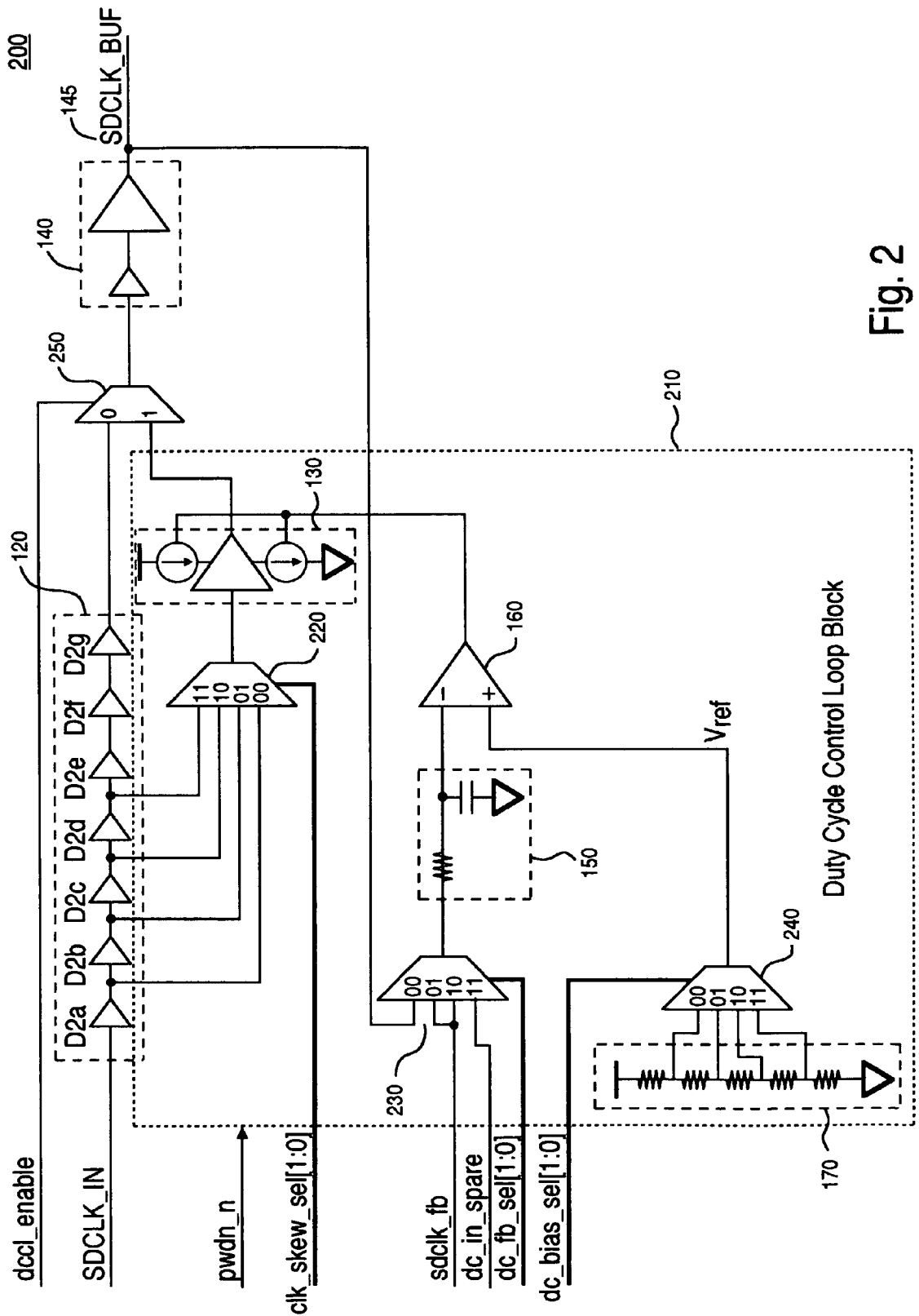
FIG. 2 is a block diagram of a duty cycle control loop, in accordance with one embodiment of the present invention.

FIG. 2 is another embodiment of the duty cycle control loop that is capable of adjusting the duty cycle of a clock signal to maintain an optimum duty cycle. As shown in FIG. 2, the duty cycle control loop is part of a circuit 200 that is capable of controlling duty cycles of a clock signal. The duty cycle control loop of FIG. 2 is similar in function to the duty cycle control loop of FIG. 1. In particular, like numbered elements provide similar functionality between FIGS. 1 and 2. Additional features are provided in the duty cycle control loop of FIG. 2.

In particular the circuit 200 provides a mechanism to reduce the part-to-part variation of the output clock duty cycle. As described previously, duty cycle distortion of an input clock signal can enter and accumulate anywhere along a clock path from the clock source (SDCLK_IN) to the output driver 140. In addition, the duty cycle distortion can accumulate anywhere in the clock path, such as the phase-locked loop, long clock buffer trees, mutliplexors, output buffer, etc. The present embodiment is able to reduce the number of points where variation of the duty cycle can occur, and reduces the part-to-part variation by centering the output duty cycle around the selected duty cycle bias point for many parts.

In particular, the duty cycle control loop comprises an input clock signal (SDCLK_IN). The input clock can be selected from multiple tap points (e.g., 4 tap points) of a buffer chain 120 to give a limited amount of skew control. This may be necessary since the duty cycle correction loop can change the rising edge or falling edge of the clock signal to correct the duty cycle, thus possibly altering the skew alignment.

For instance, the buffer chain 120 comprises a clock tree that is coupled to the clock source, SDCLK_IN, and the V-to-DC converter 130. In one embodiment the clock tree 120 provides a clock signal based on SDCLK_IN to a timing controller, as previously described. The clock tree 120 introduces duty cycle distortion to the input clock signal, SDCLK_IN, as previously described.

The output driver 140 of the duty cycle control loop is coupled to SDCLK_IN, wherein the output driver 140 presents an external output clock signal at node 145. The output signal has a duty cycle that is associated with a duty cycle distortion value.

The duty cycle correction loop of FIG. 2 is able to control duty cycles by using a negative feedback control loop 210 for correcting an output clock duty cycle. For instance, the feedback control loop 210 comprises a V-to-DC converter 130, a DC-to-V converter 150, an operational amplifier 160. Specifically, the negative feedback loop 210 adjusts duty cycle distortion value.

The DC-to-V converter 150 is coupled to a feedback node located between SDCLK_IN and the output node 145. That is, the feedback point can be selected to be from the output node 145, or from points further down the buffer chain, or internal to the chip. In particular, the feedback point is selected via a feedback select multiplexor 230. As described previously, the feedback node is associated with a feedback clock signal based on the input clock signal, wherein the DC-to-V converter converts the feedback clock signal to an average voltage.

In addition, the operational amplifier 160 is coupled to the DC-to-V converter 150 for amplifying an error between the average voltage and a reference voltage. The reference voltage is generated from a voltage divider 170. The embodiment of FIG. 2 is able to correct the high or low duty cycle clock signal and correct it to multiply selectable duty cycle bias levels (e.g., the 4:1 multiplexor 240).

Also, the V-to-DC converter 130 is coupled to the operational amplifier 160 to receive the error. The V-to-DC converter 130 is coupled to the feedback point of one of the selectable points of the buffer chain 120. That is, the V-to-DC converter 130 is coupled to the input clock signal, SDCLK_IN, through the multiplexor 220. In particular, the V-to-DC converter 130 adjusts the rising and falling edges of the received clock signal based on the error from the operational amplifier 160.

In addition, the circuit 200 includes a power down mode implemented through the multiplexor 250. This allows for testing of the circuit 200.

Figure 3:
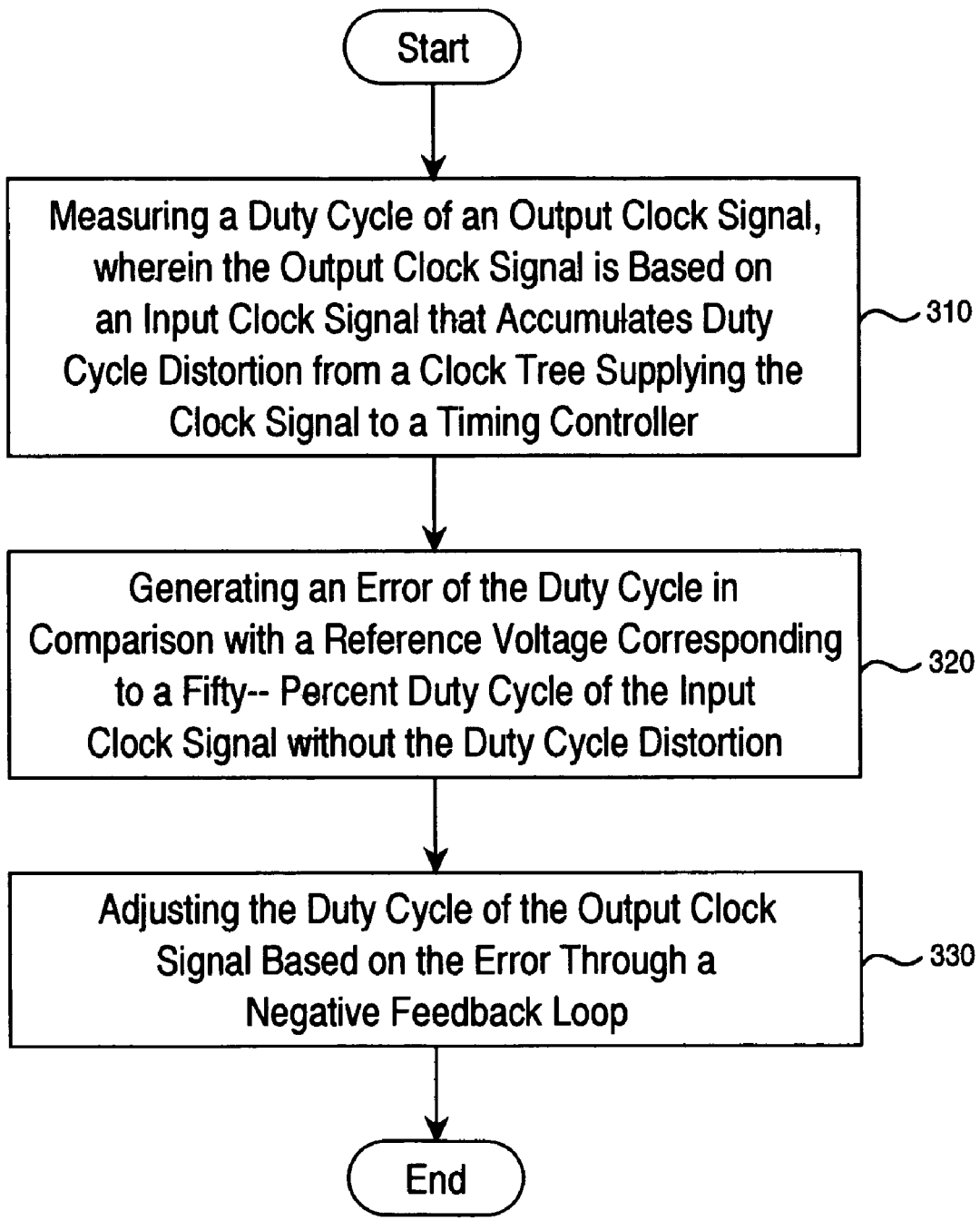
FIG. 3 is a flow chart illustrating steps in a method for controlling duty cycle of a clock signal, in accordance with one embodiment of the present invention.

FIG. 3 is a flow chart 300 of a method for controlling duty cycle of a clock signal, in accordance with one embodiment of the present invention. The method provides for compensating for duty cycle distortion due to various parts of an internal circuit (e.g., chip). In one embodiment, the method of FIG. 3 is implemented by circuit 100 of FIG. 1, or circuit 200 of FIG. 2.

At 310, the present embodiment measures a duty cycle of an output clock signal. For example, the DC-to-V converter 150 of FIGS. 1 and 2 measures the duty cycle, in one embodiment. In one embodiment, the duty cycle is measured by converting the output clock signal to an average voltage. The output clock signal is based on an input clock signal that accumulates duty cycle distortion from a clock path between a clock source and the output driver. For instance, duty cycle distortion is generated through a clock tree that supplies the clock signal to a timing controller of a video controller.

At 320, the present embodiment generates an error of the duty cycle. The error is summed and amplified with a reference voltage that corresponds to a fifty percent duty cycle of the input clock signal without any duty cycle distortion. For instance, in one embodiment, the error is summed and amplified through the operational amplifier 160 of FIGS. 1 and 2.

At 330, the present embodiment, adjusts the duty cycle of the output clock signal based on the error through a negative feedback loop, as previously described. In one embodiment, the negative feedback loop implementing the method of FIG. 3 adjusts the input clock signal after the internal clock tree that provides the clock signal to a timing controller.

Figure 4A:
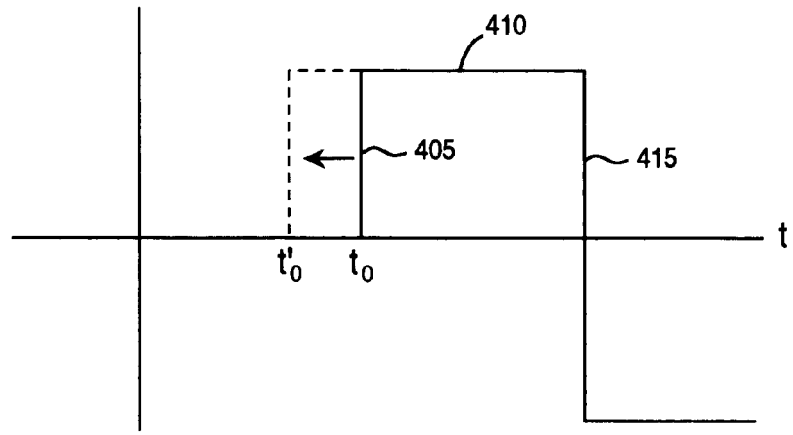
FIG. 4A is a timing diagram illustrating the increase in the duty cycle of a clock signal, in accordance with on embodiment of the present invention.
Figure 4B:
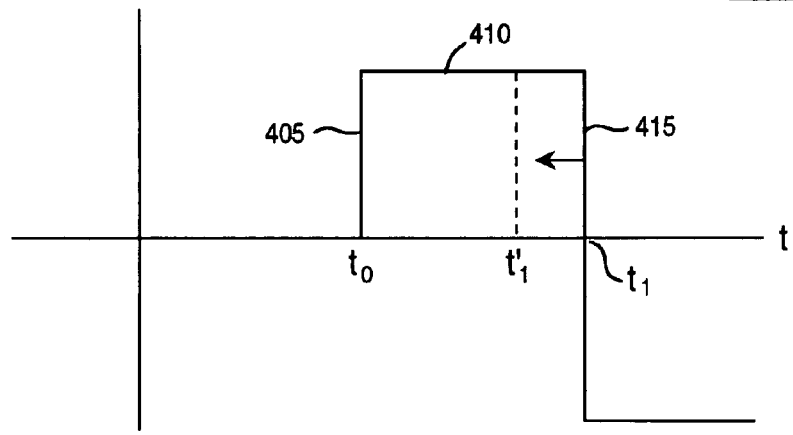
FIG. 4B is a timing diagram illustrating the decrease in the duty cycle of a clock signal, in accordance with on embodiment of the present invention.

FIGS. 4A and 4B are illustrations of adjusting the leading and falling edges of clock signal in order to achieve an output clock signal with optimum duty cycle.

For example, FIG. 4A is a timing diagram 400A illustrating the increase in the duty cycle of a clock signal, in accordance with one embodiment of the present invention. As shown in FIG. 4A, the duty cycle of the input clock signal is increased when the average voltage of the duty cycle of the output clock signal is below the reference voltage. In this case, the leading edge 405 of the clock signal 410 is moved up in time from time $t_0$ to $t_0$-prime, thereby increasing the duty cycle over one period. The falling edge 415 is not changed.

FIG. 4B is a timing diagram 400B illustrating the decrease in the duty cycle of a clock signal, in accordance with one embodiment of the present invention. As shown in FIG. 4B, the duty cycle of the input clock signal is decreased when the average voltage of the duty cycle of the output clock signal is above the reference voltage. In this case, the falling edge 405 of the clock signal 410 is moved up in time from time $t_1$ to $t_1$-prime, thereby decreasing the duty cycle over one period. The leading edge 405 is not changed.

Accordingly, various embodiments of the present invention disclose a circuit that is capable of controlling a duty cycle of a clock signal. Embodiments of the present invention are capable of controlling a clock signal duty cycle through a negative feedback loop that continually measures and adjusts an output clock duty cycle. As such, high speed interface chips are able to sufficiently control the duty cycle of an output clock signal.

Embodiments of the present invention, a circuit and method for controlling duty cycle of a clock signal are described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed is:

1. A duty cycle control loop, comprising;
    a voltage to duty cycle (V-to-DC) converter for receiving an input clock signal;
    an output driver coupled to said V-to-DC converter for providing an output clock signal based on said input clock signal, wherein said output clock signal is associated with a duty cycle distortion value;
    a duty-cycle-to-voltage (DC-to-V) converter coupled to said output driver for converting said output clock signal to an average voltage; and
    an operational amplifier coupled to said DC-to-V converter for amplifying an error between said average voltage and a reference voltage, wherein said error is fed back to said V-to-DC converter, wherein said V-to-DC converter adjusts a duty cycle of said input clock signal that is received based on said error, and wherein said V-to-DC converter comprises a current starved inverter.

2. The duty cycle control loop of claim 1, wherein said V-to-DC further comprises:
    a first current source coupled to receive said error and coupled to said current started inverter and to a constant voltage, wherein said first current source increases a duty cycle of said input clock signal; and
    a second current source coupled to receive said error and coupled to said current started inverter and to ground, wherein said second current source decreases a duty cycle of said input clock signal.

3. The duty cycle control loop of claim 1, wherein said output driver comprises:
    an output buffer coupled to said V-to-DC converter, wherein said output buffer outputs said output clock signal.

4. The duty cycle control loop of claim 1, wherein said DC-to-V converter comprises:
    a resistor capacitor (RC) circuit.

5. The duty cycle control loop of claim 1, further comprising:
    a resistor ladder for generating said reference voltage that is equal to a fifty percent duty cycle of said input clock signal.

6. The duty cycle control loop of claim 5, wherein resistor values in said resistor ladder are selected to compensate for offset in said operational amplifier.

7. The duty cycle control loop of claim 1, further comprising;
    a clock source for generating said input clock signal; and
    a timing controller comprising a clock tree that is coupled to said clock source and said V-to-DC converter, wherein said clock tree introduces duty cycle distortion to said input clock signal.

8. A duty cycle control loop, comprising;
    a clock source providing an input clock signal;
    an output driver coupled to said clock source, wherein said output driver presents an external output clock signal, and wherein said output signal comprises a duty cycle that is associated with a duty cycle distortion value; and
    a negative feedback loop for adjusting said duty cycle distortion value, wherein said negative feedback loop comprises:
        a duty-cycle-to-voltage (DC-to-V) converter coupled to a feedback node located between said clock source and an output node of said output driver, wherein said feedback node is associated with a feedback clock signal based on said input clock signal, and wherein said DC-to-V converter converts said feedback clock signal to an average voltage;

an operational amplifier coupled to said DC-to-V converter for amplifying an error between said average voltage and a reference voltage; and a voltage-to-duty cycle (V-to-DC) converter coupled to said operational amplifier to receive said error and coupled to receive said input clock signal, wherein said V-to-DC converter comprises a current starved inverter; and wherein
said V-to-DC converter adjusts rising and falling edges of said input clock signal based on said error.

9. The duty cycle control loop of claim 8, wherein said feedback node comprises an output node of said output driver.

10. The duty cycle loop of claim 8, wherein said V-to-DC converter further comprises:

a first current source coupled to receive said error and coupled to said current started inverter and to a constant voltage, wherein said first current source increases a duty cycle of said input clock signal; and a second current source coupled to receive said error and coupled to said current started inverter and to ground, wherein said second current source decreases a duty cycle of said input clock signal.

11. The duty cycle control loop of claim 8, wherein said output driver comprises:

an output buffer coupled to said V-to-DC converter, wherein said output buffer outputs said output clock signal.

12. The duty cycle control loop of claim 8, wherein said DC-to-V converter comprises:

a resistor capacitor (RC) circuit.

13. The duty cycle control loop of claim 8, further comprising:

a resistor ladder for generating said reference voltage that is equal to a fifty percent duty cycle of said input clock signal.

14. The duty cycle control loop of claim 8, further comprising:

a clock tree that is coupled to said clock source and said V-to-DC converter, wherein said clock tree provides said input clock signal to a timing controller, wherein said clock tree introduces duty cycle distortion to said input clock signal.

15. A method for controlling duty cycle, comprising:

measuring a duty cycle of an output clock signal, wherein said output clock signal is based on an input clock signal that accumulates duty cycle distortion from a clock tree supplying said input clock signal to a timing controller;

generating an error of said duty cycle in comparison with a reference voltage corresponding to a fifty percent duty cycle of said input clock signal without said duty cycle distortion; and adjusting said duty cycle of said output clock signal based on said error through a negative feedback loop.

16. The method of claim 15, wherein said measuring a duty cycle comprises:

converting said output clock signal to an average voltage.

17. The method of claim 16, wherein said generating an error comprises:

amplifying said error that is based on a difference between said average voltage and said reference voltage.

18. The method of claim 15, wherein said adjusting a duty cycle comprises:

adjusting said input signal after said clock tree.

19. The method of claim 16, wherein said adjusting a duty cycle comprises:

increasing said duty cycle of said input clock signal when said average voltage is below said reference voltage; and decreasing said duty cycle of said input clock signal when said average voltage is above said reference voltage.

* * * * *